(12) United States Patent
Ishii et al.

(10) Patent No.: US 8,692,126 B2
(45) Date of Patent: Apr. 8, 2014

(54) WIRED CIRCUIT BOARD AND PRODUCING METHOD THEREOF

(75) Inventors: Jun Ishii, Osaka (JP); Hirotoshi Iguchi, Osaka (JP)

(73) Assignee: Nitto Denko Corporation, Osaka (JP)

( * ) Notice: Subject to any disclaimer, the term of this patent is extended or adjusted under 35 U.S.C. 154(b) by 162 days.

(21) Appl. No.: 12/805,710

(22) Filed: Aug. 16, 2010

(65) Prior Publication Data

US 2011/0048785 A1 Mar. 3, 2011

Related U.S. Application Data

(60) Provisional application No. 61/272,237, filed on Sep. 3, 2009.

(30) Foreign Application Priority Data

Aug. 26, 2009 (JP) .................................. 2009-195840

(51) Int. Cl.
*H05K 1/03* (2006.01)

(52) U.S. Cl.
USPC ........... 174/255; 174/250; 174/260; 174/262; 360/234.6; 360/245.9

(58) Field of Classification Search
USPC ......... 174/250, 258–268, 350, 520, 524, 527, 174/528, 531, 546, 549, 552
See application file for complete search history.

(56) References Cited

U.S. PATENT DOCUMENTS

| | | | |
|---|---|---|---|
| 6,100,582 A | * | 8/2000 | Omote et al. .................. 257/699 |
| 7,893,435 B2 | * | 2/2011 | Kazlas et al. .................... 257/59 |
| 2005/0012217 A1 | | 1/2005 | Mori et al. |
| 2005/0167281 A1 | * | 8/2005 | Ohsawa et al. ................ 205/223 |
| 2006/0185141 A1 | * | 8/2006 | Mori et al. .................... 29/25.41 |
| 2009/0014410 A1 | | 1/2009 | Yokai et al. |
| 2009/0116150 A1 | * | 5/2009 | Ohsawa et al. ............. 360/245.9 |
| 2011/0035939 A1 | | 2/2011 | Mori et al. |

FOREIGN PATENT DOCUMENTS

| | | |
|---|---|---|
| CN | 1649473 A | 8/2005 |
| CN | 101389187 A | 3/2009 |
| JP | 2001-244163 A | 9/2001 |
| JP | 2003-017830 A | 1/2003 |
| JP | 2004-022606 A | 1/2004 |
| JP | 2005-217250 | 8/2005 |
| JP | 2005-217250 A | 8/2005 |
| JP | 2007-109725 A | 4/2007 |
| JP | 2009-038338 A | 2/2009 |
| WO | WO-2004/054340 A1 | 6/2004 |

OTHER PUBLICATIONS

First Office Action issued by the State Intellectual Property Office of P.R. China (SIPO) on Nov. 19, 2013, in connection with CN201010254968.9.

* cited by examiner

*Primary Examiner* — Courtney Smith
(74) *Attorney, Agent, or Firm* — Jean C. Edwards; Edwards Niels PLLC

(57) ABSTRACT

A wired circuit board includes a metal supporting layer, an insulating layer formed on the metal supporting layer, and a conductive layer formed on the insulating layer. In the metal supporting layer, a reference hole for positioning is formed, and a stepped portion is formed so as to surround the reference hole.

12 Claims, 10 Drawing Sheets

FIG.5
(a)
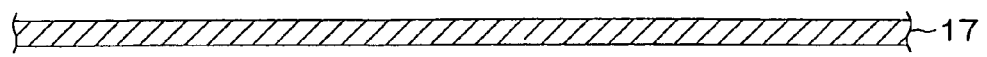
(b)
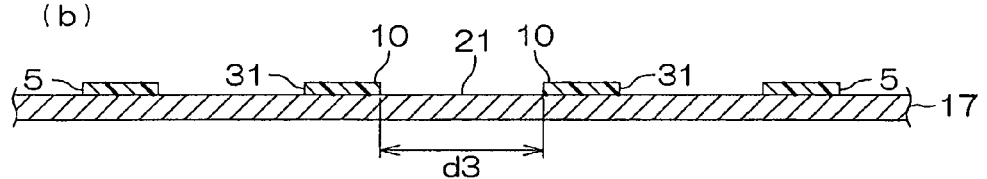
(c)
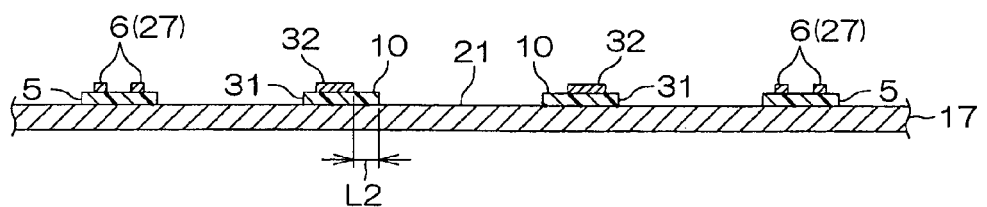
(d)
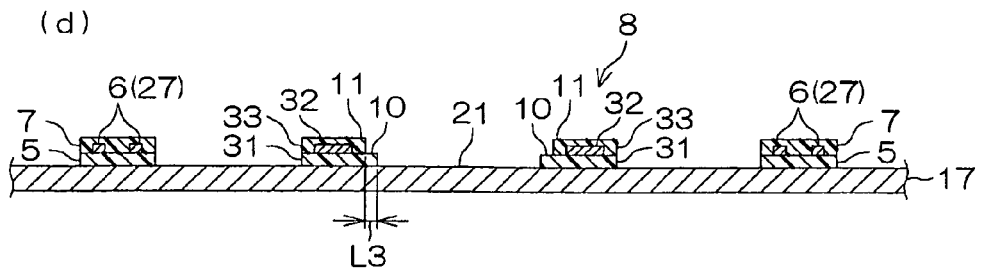

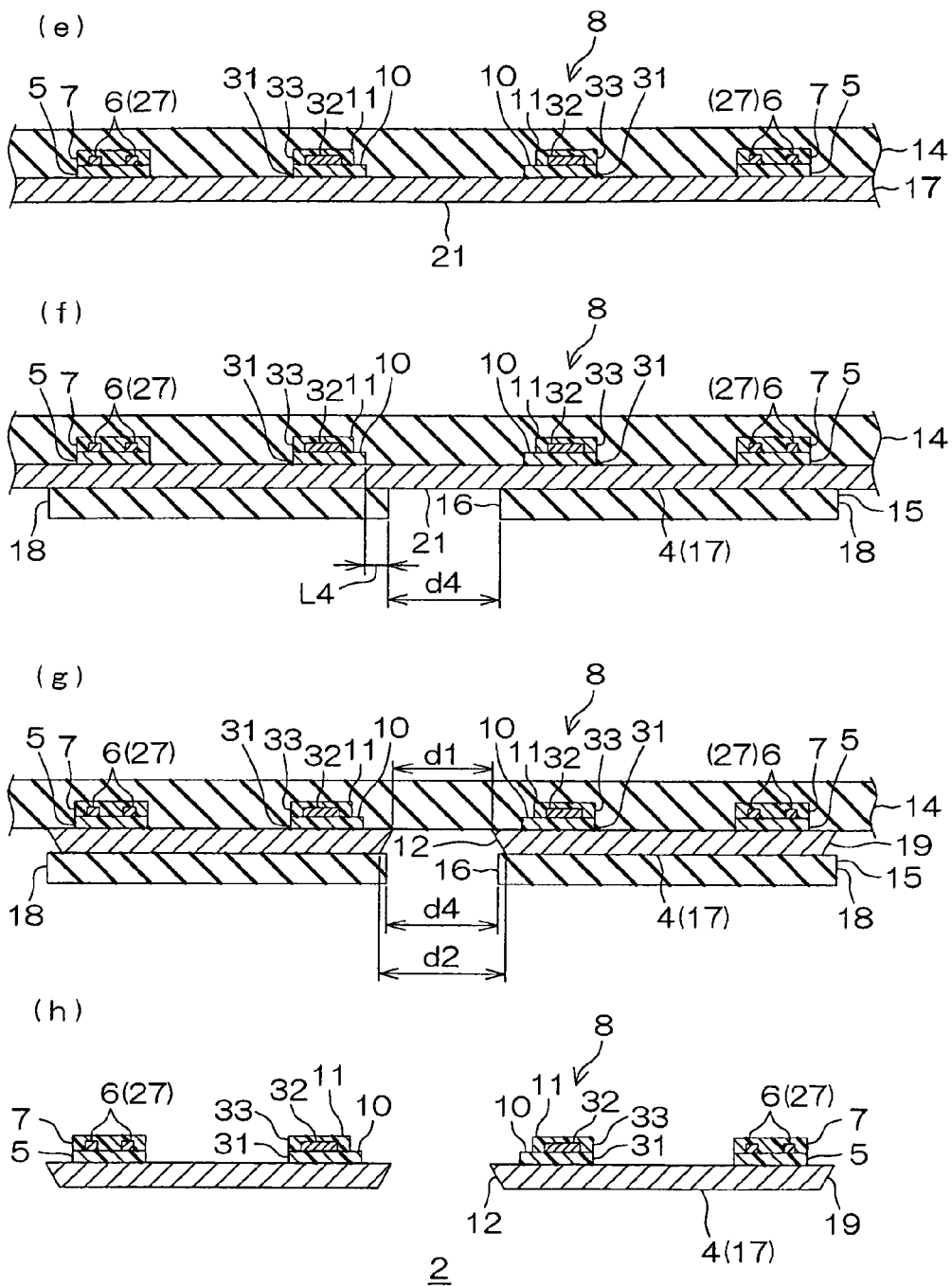

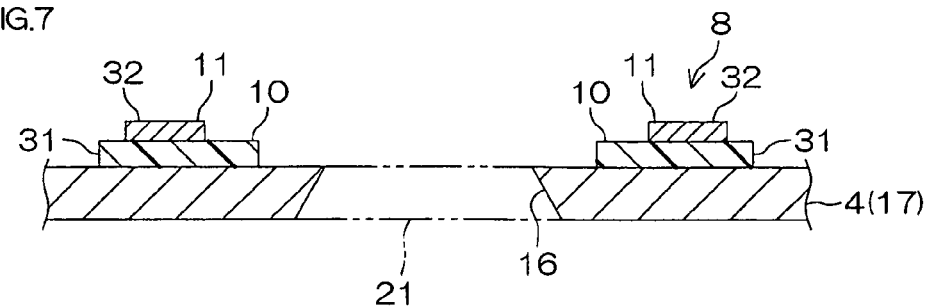
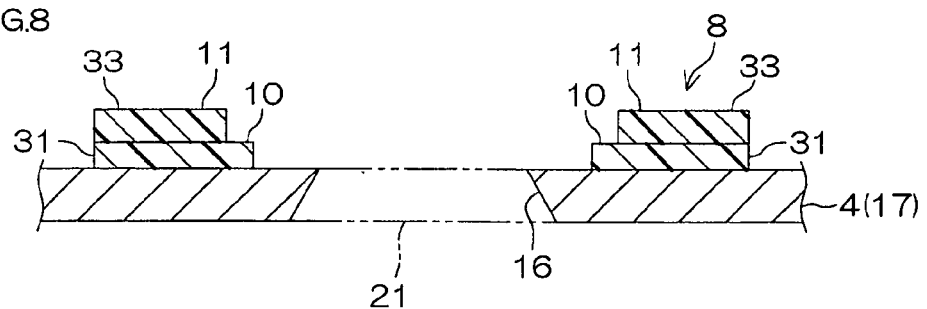
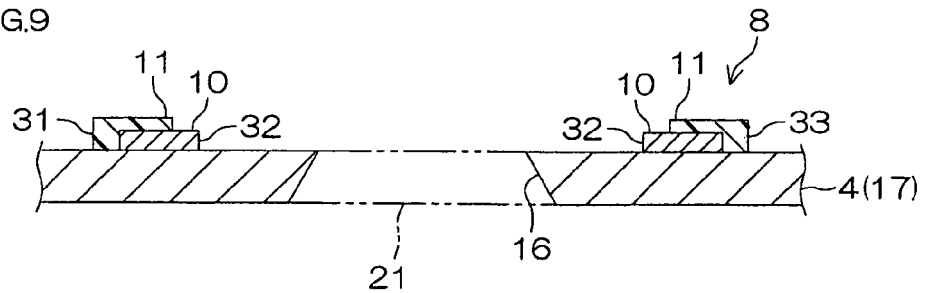
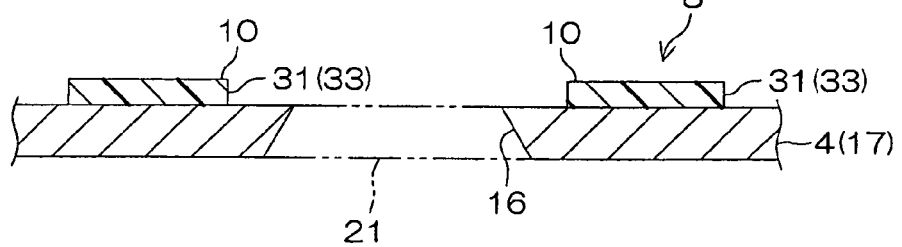

FIG.16
(a)
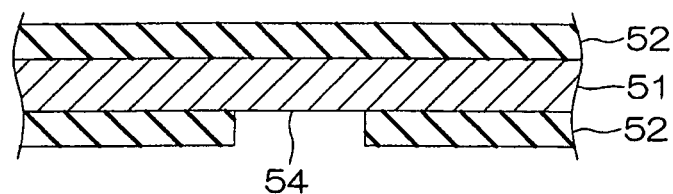
(b)
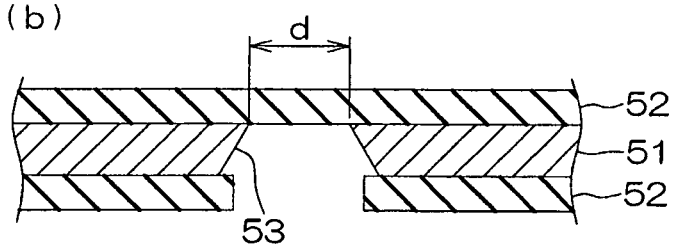
(b')
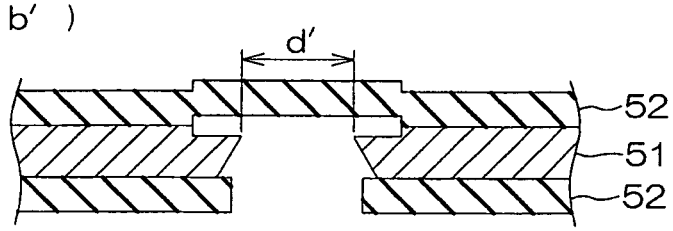

WIRED CIRCUIT BOARD AND PRODUCING METHOD THEREOF

CROSS-REFERENCE TO RELATED APPLICATION

The present application claims the benefit of U.S. Provisional Application No. 61/272,237 filed on Sep. 3, 2009, and claims priority from Japanese Patent Application No. 2009-195840 filed on Aug. 26, 2009, the contents of which are herein incorporated by reference into this application.

BACKGROUND OF THE INVENTION

1. Field of the Invention

The present invention relates to a wired circuit board and a producing method thereof and, more particularly, to a wired circuit board used appropriately for a suspension board with circuit which is mounted in a hard disk drive and a producing method thereof.

2. Description of the Related Art

A suspension board with circuit is obtained by successively laminating an insulating base layer, a conductive layer having terminal portions, and an insulating cover layer on a metal supporting layer, and then trimming the metal supporting layer.

Such a suspension board with circuit is typically mounted in a hard disk drive after a magnetic head is positioned using a reference hole formed in a metal supporting layer as a reference, and mounted in the suspension board with circuit.

In recent years, the terminals of a magnetic head and the terminal portions of a suspension board with circuit have been configured at a finer pitch, so that it is necessary to increase the reliability of connection therebetween. Therefore, it is needed to form the reference hole with high accuracy to improve the accuracy of positioning of the magnetic head.

To satisfy the need, a method has been proposed in which, e.g., a material more resistant to etching than stainless steel, such as zirconium or palladium, is stuck to a surface of a suspension board made of stainless steel, and then the suspension board is etched to form reference holes (see, e.g., Japanese Unexamined Patent No. 2005-217250). In the etching step of Japanese Unexamined Patent No. 2005-217250, the reference holes are bored such that the inner end surfaces of the suspension board (the inner circumferential surfaces of the reference holes) are uniformly etched due to the above-mentioned material stuck to the suspension board to improve the accuracy of processing of the reference holes.

SUMMARY OF THE INVENTION

However, in conventional etching steps including the etching step of Japanese Unexamined Patent No. 2005-217250, as shown in FIG. 16(a), an etching resist 52 is laminated first on each of the top and back surfaces of a metal supporting layer 51, and subsequently opened so as to expose a predetermined hole formation region 54 for a reference hole 53 (see FIG. 16(b)) at the back surface of the metal supporting layer 51. Then, as shown in FIG. 16(b), the predetermined hole formation region 54 exposed from the etching resist 52 is removed through contact with an etchant to bore the reference hole 53.

Since the etching for the reference hole 53 advances from the back surface of the metal support layer 51 toward the top surface thereof, the reference hole 53 is formed in an inclined shape which gradually tapers in width from the back surface of the metal supporting layer 51 toward the top surface thereof. Accordingly, the accuracy of positioning of the reference hole 53 is determined by the inner circumferential surface of the upper end portion of the reference hole 53 having a minimum diameter d.

However, in such etching, an etchant may enter the interface between the top-side etching resist 52 and the metal supporting layer 51 to cause the delamination of the etching resist 52 from the metal supporting layer 51 around the predetermined hole formation region 54. Consequently, as shown in FIG. 16(b'), a gap is formed therebetween, and the etching further advances to remove the metal supporting layer 51 around the upper end portion of the reference hole 53. As a result, the minimum diameter d' of the reference hole 53 is increased, and the minimum diameter d' of the reference hole 53 is likely to vary, so that the accuracy of positioning of the reference hole 53 is insufficient. Accordingly, the accuracy of positioning of the magnetic head decreases to result in the problem of degraded connection reliability.

It is therefore an object of the present invention to provide a wired circuit board in which a reference hole is uniformly formed with excellent accuracy and a producing method thereof.

A wired circuit board of the present invention includes a metal supporting layer, an insulating layer formed on the metal supporting layer, and a conductive layer formed on the insulating layer, wherein a reference hole for positioning is formed in the metal supporting layer, and a stepped portion is formed so as to surround the reference hole.

In the wired circuit board of the present invention, it is preferable that the stepped portion is formed in the same layer as the insulating layer and/or the conductive layer.

In the wired circuit board of the present invention, it is preferable that a distance between the stepped portion and the reference hole is not more than 100 μm.

In the wired circuit board of the present invention, it is preferable that the stepped portion has a thickness of not less than 5 μm.

In the wired circuit board of the present invention, it is preferable that the insulating layer is formed of polyimide.

In the wired circuit board of the present invention, it is preferable that the conductive layer is formed of copper.

It is preferable that the wired circuit board of the present invention is used as a suspension board with circuit.

A producing method of the wired circuit board of the present invention includes the step of forming a metal supporting layer, forming an insulating layer on the metal supporting layer, and forming a conductive layer on the insulating layer, the step of forming a stepped portion such that a to-be-removed region for boring a reference hole used for positioning is surrounded thereby, and a reference hole forming step of etching the to-be-removed region of the metal supporting layer to form the reference hole, wherein the reference hole forming step includes the steps of forming an etching resist so as to cover the stepped portion therewith on one side of the metal supporting layer in a thickness direction and expose the to-be-removed region on the other side of the metal supporting layer in the thickness direction, removing the to-be-removed region exposed from the etching resist by etching, and removing the etching resist.

In the wired circuit board of the present invention, the stepped portion is formed so as to surround the reference hole. Accordingly, in the producing method of the wired circuit board of the present invention, the stepped portion described above is formed, and then the etching resist is formed in the reference hole forming step so as to cover the stepped portion on the one side of the metal supporting layer in the thickness direction. This allows a larger contact area to be ensured between the etching resist, and the metal supporting layer and the stepped portion around the reference hole, and allows an improvement in the adherence therebetween.

In addition, since the stepped portion can ensure hook-like engagement with the etching resist, the adherence between the stepped portion and the etching resist can further be improved.

Therefore, even when the etching resist is formed so as to expose the to-be-removed region on the other side of the metal supporting layer in the thickness direction, and then the to-be-removed region is removed by etching, it is possible to prevent an etchant from entering the interface between the etching resist and the metal supporting layer around the to-be-removed region, and prevent the etching resist from being delaminated from the metal supporting layer.

This prevents an increase in the minimum diameter of the reference hole resulting from the entrance of the etchant, and allows the reference hole to be uniformly formed with excellent accuracy.

As a result, it is possible to improve positioning accuracy, and thereby improve connection reliability.

BRIEF DESCRIPTION OF THE DRAWINGS

FIG. 5 is a production process view for illustrating a producing method of the suspension-board-with-circuit assembly sheet shown in FIG. 1, which corresponds to FIG. 3,
  (a) showing the step of preparing a metal supporting board,
  (b) showing the step of forming an insulating base layer and a stepped base layer,
  (c) showing the step of forming a conductive layer and a stepped conductive layer, and
  (d) showing the step of forming an insulating cover layer and a stepped cover layer;

FIG. 6 is a production process view for illustrating, subsequently to FIG. 5, the producing method of the suspension-board-with-circuit assembly sheet shown in FIG. 1, which corresponds to FIG. 3,
  (e) showing the step of forming a first etching resist on the metal supporting board,
  (f) showing the step of forming a second etching resist under the metal supporting board,
  (g) showing the step of removing a first to-be-removed region by etching to form the first reference hole, and
  (h) showing the step of removing the first etching resist and the second etching resist;

FIG. 7 is an enlarged cross-sectional view of a first reference hole and a first stepped portion (bi-level implementation formed of a stepped based layer and a stepped conductive layer) in a suspension board with circuit which is another embodiment of the wired circuit board of the present invention;

FIG. 8 is an enlarged cross-sectional view of a first reference hole and a first stepped portion (bi-level implementation formed of a stepped base layer and a stepped cover layer in which a stepped conductive layer is not embedded) in a suspension board with circuit which is still another embodiment of the wired circuit board of the present invention;

FIG. 9 is an enlarged cross-sectional view of a first reference hole and a first stepped portion (bi-level implementation formed of a stepped conductive layer and a stepped cover layer) in a suspension board with circuit which is yet another embodiment of the wired circuit board of the present invention;

FIG. 10 is an enlarged cross-sectional view of a first reference hole and a first stepped portion (mono-level implementation formed of a stepped base layer or a stepped cover layer) in a suspension board with circuit which is still another embodiment of the wired circuit board of the present invention;

FIG. 16 is a cross-sectional view (production process view) for illustrating a method of forming a reference hole in a conventional suspension board with circuit,
  (a) showing the step of laminating an etching resist on each of the top and back surfaces of a metal supporting layer,
  (b) showing the step of removing a predetermined hole formation region by etching to bore the reference hole, and
  (b') showing the state where the metal supporting layer around the upper end portion of the reference hole is removed.

DETAILED DESCRIPTION OF THE INVENTION

Figure 1:
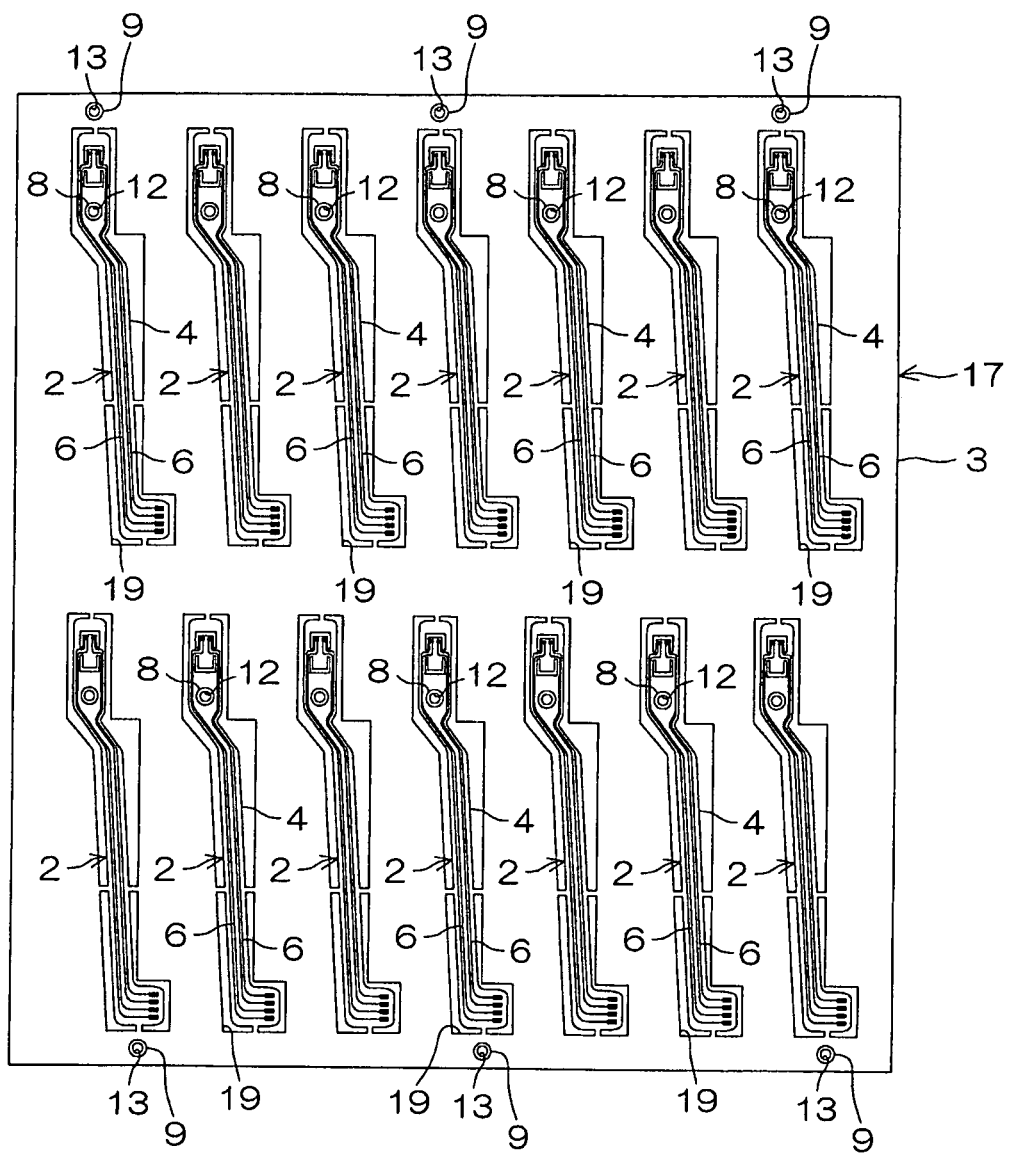
FIG. 1 is a plan view of a suspension-board-with-circuit assembly sheet including suspension boards with circuit which are an embodiment of a wired circuit board of the present invention.
Figure 2:
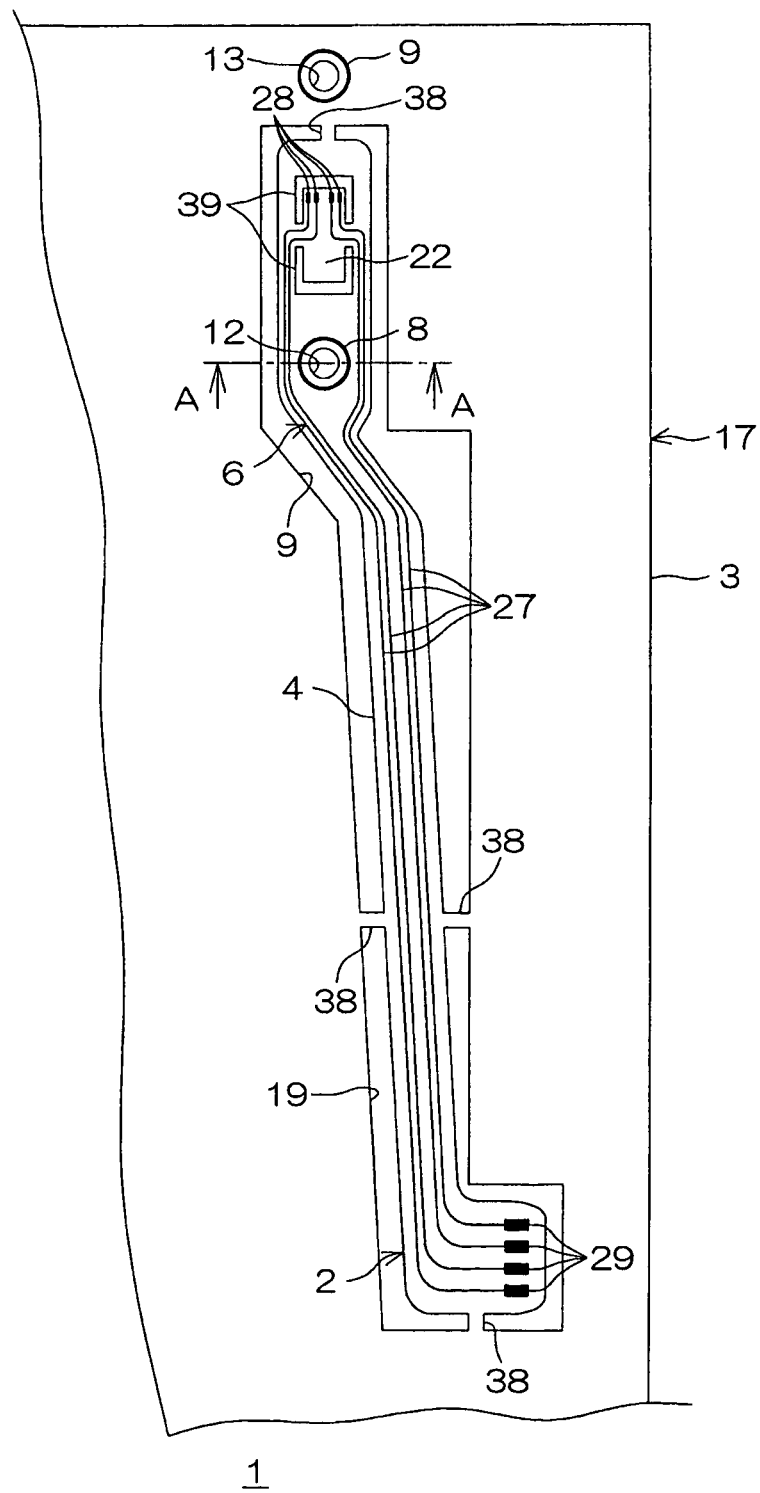
FIG. 2 is a an enlarged plan view of a principal portion of the suspension-board-with-circuit assembly sheet shown in FIG. 1.
Figure 3:
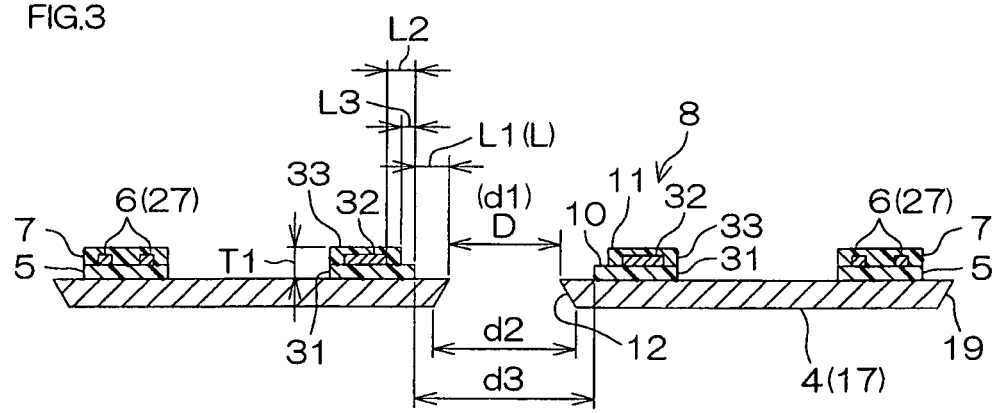
FIG. 3 is a cross-sectional view of the suspension board with circuit along the line A-A of FIG. 2.
Figure 4:
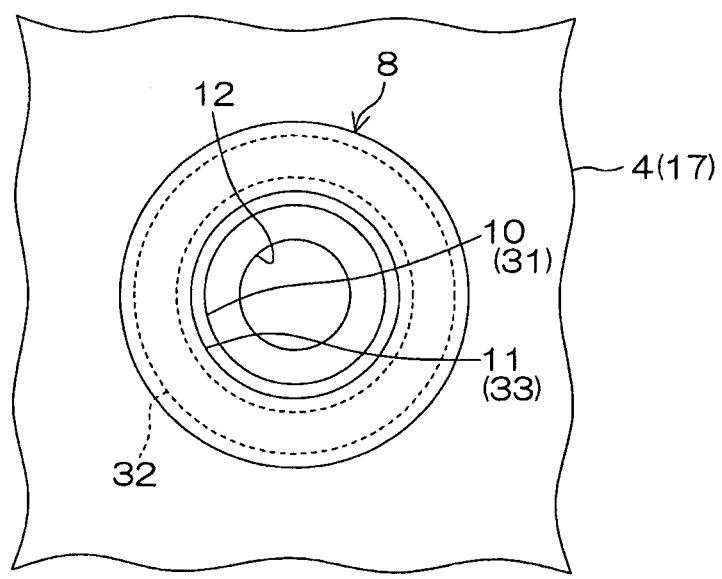
FIG. 4 is a plan view of a first reference hole and a first stepped portion of the suspension board with circuit shown in FIG. 2.

FIG. 1 is a plan view of a suspension-board-with-circuit assembly sheet including suspension boards with circuit which are an embodiment of a wired circuit board of the present invention. FIG. 2 is a an enlarged plan view of a principal portion of the suspension-board-with-circuit assembly sheet shown in FIG. 1. FIG. 3 is a cross-sectional view of the suspension board with circuit along the line A-A of FIG. 2. FIG. 4 is a plan view of a first reference hole and a first stepped portion of the suspension board with circuit shown in FIG. 2. FIGS. 5 and 6 are production process views each for illustrating a producing method of the suspension-board-with-circuit assembly sheet shown in FIG. 1, which correspond to FIG. 3.

Note that, in FIGS. 1 and 2, an insulating base layer 5 and an insulating cover layer 7, each described later, are omitted.

In FIG. 1, a suspension-board-with-circuit assembly sheet 1 as the wired circuit board includes a plurality of suspension boards with circuit 2, and a support frame 3 removably supporting each of the suspension boards with circuit 2.

The suspension boards with circuit 2 extend in a longitudinal direction (front-to-rear direction), and are disposed in the support frame 3 to be aligned and spaced apart from each other in the longitudinal direction and a widthwise direction (direction perpendicular to the longitudinal direction). The suspension boards with circuit 2 are each supported by the support frame 3 via joint portions 38 (described later; see FIG. 2) that can be cut.

In each of the suspension boards with circuit 2, a conductive layer 6 for electrically connecting a magnetic head (not shown) and a read/write board (not shown) is formed, as shown in FIG. 2.

The conductive layer 6 is formed in a pattern integrally including head-side terminals 28 for connecting to the terminals of the magnetic head, external terminals 29 for connecting to the terminals of the read/write board, and wires 27 for connecting the head-side terminals 28 and the external terminals 29, which is described later.

As shown in FIG. 3, the suspension board with circuit 2 includes a metal supporting board 4, the insulating base layer 5 as an insulating layer formed on the metal supporting board 4, the conductive layer 6 formed on the insulating base layer 5, and the insulating cover layer 7 formed on the insulating base layer 5 so as to cover the conductive layer 6.

As shown in FIGS. 1 and 2, the metal supporting board 4 is formed together with the support frame 3 from a metal supporting layer 17, and formed in a generally rectangular flat-plate shape in plan view. Examples of a metal used to form the metal supporting layer 17 including the metal supporting board 4 include stainless steel and a 42-alloy. Preferably, stainless steel is used. The thickness of the metal supporting layer 17 is in a range of, e.g., 10 to 100 µm, or preferably 18 to 30 µm.

In the metal supporting board 4, slits 39 and first reference holes 12 each as a reference hole described later in detail are formed by partially cutting out (opening) the metal supporting layer 17, and first stepped portions 8 each as a stepped portion described later in detail are provided around the respective first reference holes 12. The slits 39 are each bored in a generally U-shape in plan view to have the head-side terminals 28 interposed therebetween in the longitudinal direction.

As shown in FIG. 3, the insulating base layer 5 is formed on the upper surface of the metal supporting board 4 into a pattern corresponding to a portion where the conductive layer 6 is formed. Examples of an insulating material used to form the insulating base layer 5 include synthetic resins such as polyimide, acryl, polyether nitrile, polyether sulfone, polyethylene terephthalate, polyethylene naphthalate, and polyvinyl chloride. Among them, a photosensitive synthetic resin is used preferably for forming the insulating base layer 5 in an accurate pattern and, more preferably, photosensitive polyimide is used. The thickness of the insulating base layer 5 is in a range of, e.g., 3 to 30 µm, or preferably 5 to 15 µm.

As shown in FIG. 2, the conductive layer 6 integrally includes the plurality of wires 27 arranged in parallel and mutually spaced-apart relation, and the head-side terminals 28 and the external terminals 29 which are continued from the respective front end portions and rear end portions of the individual wires 27. Note that the wires 27 are disposed on the both widthwise end portions in a region rearward of the front-side slit 39. Specifically, the wires 27 are formed so as to ensure a region where the first stepped portion 8 described later is provided at a widthwise midpoint (a center portion) in a region rearward of the rear-side slit 39.

Examples of a conductive material used to form the conductive layer 6 include metal foils of copper, nickel, gold, a solder, and alloys thereof. In terms of conductivity and workability, a copper foil is preferably used. The thickness of the conductive layer 6 is in a range of, e.g., 3 to 20 µm, or preferably 7 to 15 µm. The width of each of the wires 27 is in a range of, e.g., 5 to 500 µm, or preferably 10 to 200 µm. The spacing between the individual wires 27 is in a range of, e.g., 5 to 500 µm, or preferably 10 to 200 µm.

As shown in FIG. 3, the insulating cover layer 7 is formed on the insulating base layer 5 into a pattern covering the wires 27 and exposing the head-side terminals 28 and the external terminals 29. As an insulating material for forming the insulating cover layer 7, the same insulating material as that of the insulating base layer 5 shown above is used and, preferably, photosensitive polyimide is used. The thickness of the insulating cover layer 7 is in a range of, e.g., 3 to 20 µm, or preferably 4 to 15 µm.

As shown in FIGS. 1 and 2, the support frame 3 is formed together with the joint portions 38 and the metal supporting board 4 by partially trimming (cutting out) the metal supporting layer 17 correspondingly to the outer shape of each of the suspension boards with circuit 2 in a producing method (see FIGS. 5 and 6) of the suspension-board-with-circuit assembly sheet 1 described later.

In the support frame 3, gap grooves 19 having a generally frame-like shape in plan view are formed between the inner peripheral edge portions of the support frame 3 surrounding the suspension boards with circuit 2 and the outer peripheral edge portions of the suspension boards with circuit 2 so as to surround the suspension boards with circuit 2.

In addition, the joint portions 38 are formed so as to traverse the gap grooves 19 described above. The joint portions 38 are formed so as to extend from the inner peripheral edge portions of the support frame 3 through the gap grooves 19 and reach the outer peripheral edge portions of the suspension boards with circuit 2.

In the peripheral end portion of the support frame 3, second reference holes 13 each as the reference hole are formed and, around the second reference holes 13, second stepped portions 9 each as the stepped portion are provided.

Thus, the suspension-board-with-circuit assembly sheet 1 is formed of the plurality of suspension boards with circuit 2 which are disposed to be aligned and spaced apart from each other in the widthwise direction and the longitudinal direction, and supported by the support frame 3 via the joint portions 38.

The first reference holes 12 and the second reference holes 13 each described above are used for positioning the magnetic head (not shown) and positioning each of the suspension boards with circuit 2 with respect to a load beam (not shown).

Specifically, when the magnetic head is mounted on the suspension board with circuit 2 or when the suspension board with circuit 2 is spot-welded to the load beam, pins (not shown) are inserted into the first reference holes 12 and the second reference holes 13 to be positioned.

In FIGS. 3 and 4, the first reference hole 12 is formed in a generally circular shape in plan view so as to extend through the metal supporting board 4 in the thickness direction thereof. The first reference hole 12 is also formed in a generally trapezoidal cross-sectional shape which gradually inclinedly tapers in width from the lower surface of the metal supporting board 4 toward the upper surface thereof.

Accordingly, the minimum diameter D of the first reference hole 12 is the same as the inner diameter d1 of the upper end portion of the first reference hole 12, and set correspondingly to the outer diameter (maximum diameter) of each of the pins (not shown) used for positioning. The minimum diameter D of the first reference hole 12 is set in a range of, e.g., 200 to 1200 µm, or preferably 400 to 1000 µm. Note that the inner diameter d2 of the lower end portion of the first reference hole 12 is in a range of, e.g., 220 to 1220 µm, or preferably 420 to 1020 µm.

The first stepped portion 8 is formed on the metal supporting board 4 so as to surround the first reference hole 12. More specifically, each of the first stepped portions 8 is formed in a generally annular shape in plan view concentrically surrounding the first reference hole 12. The first stepped portion 8 includes a stepped base layer 31 formed on the metal supporting board 4, a stepped conductive layer 32 formed on the stepped base layer 31, and a stepped insulating cover layer 33 formed on the stepped base layer 3 so as to cover the stepped conductive layer 32.

The stepped base layer 31 is formed so as to correspond to the outer shape of the first stepped portion 8, and formed in a generally annular shape in plan view at the upper surface of the metal supporting board 4.

The stepped base layer 31 is formed as the same layer as the insulating base layer 5 described above. The inner diameter d3 of the stepped base layer 31 is in a range of, e.g., 230 to 1230 µm, or preferably 430 to 1030 µm. The distance L1 between the inner circumferential surface of the stepped base layer 31 and the inner circumferential surface (upper end edge) of the first reference hole 12 is in a range of, e.g., not more than 100 µm, or preferably not more than 60 µm, and generally not less than 5 µm, or more preferably not less than 10 µm.

The distance L1 mentioned above is substantially the same as the distance L between the first stepped portion 8 and the first reference hole 12. When the distance L between the first stepped portion 8 and the first reference hole 12 exceeds the range shown above, it may be impossible to ensure a sufficient contact area between a first etching resist 14 and each of the metal supporting layer 17 and the stepped portion 8 in a reference hole forming step, and improve the adherence therebetween.

The width (radial length, i.e., the distance between the inner circumferential surface and the outer circumferential surface) of the stepped base layer 31 is in a range of, e.g., 50 to 1000 µm, or preferably 80 to 500 µm.

The stepped conductive layer 32 is disposed at a radial midpoint at the upper surface of the stepped base layer 31, and formed in a generally annular shape in plan view.

Also, the stepped conductive layer 32 is formed as the same layer as the conductive layer 6 described above.

The distance L2 between the inner circumferential surface of the stepped conductive layer 32 and the inner circumferential surface of the stepped base layer 31 is in a range of, e.g., 5 to 100 µm, or preferably 20 to 80 µm. The width (radial length, i.e., the distance between the inner circumferential surface and the outer circumferential surface) of the stepped conductive layer 32 is in a range of, e.g., 10 to 900 µm, or preferably 30 to 400 µm.

The stepped cover layer 33 covers the upper surface and both side surfaces (inner side surface and outer side surface) of the stepped conductive layer 32 and the upper surface of the stepped base layer 31 exposed from the stepped conductive layer 32. Specifically, the stepped cover layer 33 is formed such that the inner circumferential surface thereof exposes the inner end portion of the stepped base layer 31 and the outer circumferential surface thereof is located at the same position as that of the outer circumferential surface of the stepped base layer 31 when viewed in plan view.

The stepped cover layer 33 is formed in a generally annular shape in plan view in which the stepped conductive layer 32 is embedded in the thickness direction. The stepped cover layer 33 is formed as the same layer as the insulating cover layer 7 described above.

The distance L3 between the inner circumferential surface of the stepped cover layer 33 and the inner circumferential surface of the stepped base layer 31 is in a range of, e.g., not more than 100 µm, or preferably 10 to 50 µm. The width (radial length, i.e., the distance between the inner circumferential surface and the outer circumferential surface) of the stepped cover layer 33 is in a range of, e.g., 50 to 1000 µm, or preferably 80 to 500 µm.

In the first stepped portion 8, the upper surface and inner circumferential surface of the inner end portion of the stepped base layer 31 protruding from the inner circumferential surface of the stepped cover layer 33 in a radially inward direction form a first stepped part 10, and the upper surface and inner circumferential surface of the inner end portion of the stepped cover layer 33 form a second stepped part 11. That is, the first stepped portion 8 includes the first stepped part 10 and the second stepped part 11, and formed in a bi-level stepped shape in which each of the first stepped part 10 and the second stepped part 11 stepwise rises in level from a radially inner lower position to a radially outer higher position.

The thickness T1 of the first stepped portion 8 is in a range of, e.g., not less than 5 µm, or preferably not less than 10 µm, and generally not more than 100 µm, or preferably not more than 30 µm.

When the thickness T1 of the first stepped portion 8 is under the range shown above, it may be impossible to ensure a sufficient contact area between the first etching resist 14 (described later) and each of the metal supporting layer 17 and the first stepped portion 8 in the reference hole forming step, and improve the adherence therebetween.

As shown in FIG. 1, the plurality of second reference holes 13 are formed in the upper end portion and lower end portion of the support frame 3. The individual second reference holes 13 are formed in widthwise spaced-apart relation. The second reference holes 13 are formed in the same manner as the first reference holes 12.

The second stepped portions 9 are provided correspondingly to the second reference holes 13. As shown in FIG. 2, the second stepped portions 9 are formed to individually surround the respective second reference holes 13. The second stepped portions 9 are formed in the same manner as the first stepped portions 8 described above.

Next, the producing method of the suspension-board-with-circuit assembly sheet 1 of the present invention is described with reference to FIGS. 5 and 6.

In the method, as shown in FIG. 5(a), the metal supporting layer 17 is prepared first. As shown in FIG. 1, the metal supporting layer 17 is formed in a generally rectangular flat-plate shape in plan view.

Next, as shown in FIG. 5(b), the insulating base layer 5 is formed on the metal supporting layer 17, while the stepped base layer 31 is simultaneously formed on the metal supporting layer 17.

To simultaneously form the insulating base layer 5 and the stepped base layer 31, for example, a solution (varnish) of a synthetic resin is coated on the entire upper surface of the metal supporting layer 17, and then dried.

Subsequently, the coating is cured by heating as necessary, and then formed into the foregoing pattern by etching or the like. In the case of using a photosensitive synthetic resin, a solution (varnish) of the photosensitive synthetic resin is coated, dried, exposed to light, and then developed. Thereafter, the coating is cured by heating as necessary to allow the insulating base layer 5 and the stepped base layer 31 to be simultaneously formed in the foregoing pattern. To simultaneously form the insulating base layer 5 and the stepped base layer 31, it is also possible to preliminarily form a film from a synthetic resin into the foregoing pattern, and then stick the film onto the upper surface of the metal supporting layer 17 via a known adhesive layer.

Note that the stepped base layer 31 is formed so as to surround first to-be-removed regions 21 of the metal supporting layer 17 each as a to-be-removed region corresponding to the positions where the first reference holes 12 are to be bored, and surround second to-be-removed regions (not shown) of the meal supporting layer 17 each as the to-be-removed region corresponding to the positions where the second reference holes 13 are to be bored.

Next, as shown in FIG. 5(c), the conductive layer 6 is formed on the insulating base layer 5, while the stepped conductive layer 32 is simultaneously formed on the stepped base layer 31.

To simultaneously form the conductive layer 6 and the stepped conductive layer 32, a known patterning method such as an additive method or a subtractive method is used. Preferably, the additive method is used.

Next, as shown in FIG. 5(d), the insulating cover layer 7 is formed on the insulating base layer 5 so as to cover the conductive layer 6, while the stepped cover layer 33 is simultaneously formed on the stepped base layer 31 so as to cover the stepped conductive layer 32.

To simultaneously form the insulating cover layer 7 and the stepped cover layer 33, for example, a solution of the synthetic resin shown above is coated on the entire upper surface of the metal supporting layer 17 including the insulating base layer 5, the conductive layer 6, the stepped base layer 31, and the stepped conductive layer 32, and then dried. Subsequently, the coating is cured by heating as necessary, and then formed into the foregoing pattern by etching or the like. In the case of using a photosensitive synthetic resin, a solution (varnish) of the photosensitive synthetic resin is coated on the entire upper surface of the metal supporting layer 17 including the insulating base layer 5, the conductive layer 6, the stepped base layer 31, and the stepped conductive layer 32, dried, exposed to light, and then developed. Thereafter, the coating is cured by heating as necessary to allow the insulating cover layer 7 and the stepped cover layer 33 to be formed simultaneously in the foregoing pattern. To simultaneously form the insulating cover layer 7 and the stepped cover layer 33, it is also possible to preliminarily form a film from a synthetic resin into the foregoing pattern, and stick the film onto each of the conductive layer 6, the insulating base layer 5, the stepped conductive layer 32, and the stepped base layer 31 via a known adhesive layer.

Note that the insulating cover layer 7 is formed so as to expose the head-side terminals 28 and the external terminals 29.

In this manner, the first stepped portions 8 and the second stepped portions 9 (see FIG. 2) each including the stepped base layer 31, the stepped conductive layer 32, and the stepped cover layer 33 are simultaneously formed so as to respectively surround the first to-be-removed regions 21 and the second to-be-removed regions (not shown).

Next, as shown in FIGS. 2 and 6(e) to 6(h), the suspension boards with circuit 2 and the support frame 3 are simultaneously formed, while the first reference holes 12 and the second reference holes 13 are simultaneously formed (reference hole forming step).

To simultaneously form the suspension boards with circuit 2, the support frame 3, the first reference holes 12, and the second reference holes 13, the respective portions of the metal supporting layer 17 corresponding to the slits 39 and the gap grooves 19 and the respective portions (i.e., the first to-be-removed regions 21 and the second to-be-removed regions not shown) of the metal supporting layer 17 corresponding to the first reference holes 12 and the second reference holes 13 are etched.

That is, a shown in FIG. 6(e), the first etching resist 14 as an etching resist is first formed on the metal supporting layer 17 so as to cover the first stepped portions 8 and the second stepped portions (see FIG. 2).

The first etching resist 14 is formed as follows. For example, a dry film resist is laminated on the entire upper surface of the metal supporting layer 17 including the insulating base layer 5, the conductive layer 6, the insulating cover layer 7, the first stepped portions 8, and the second stepped portions 9 (see FIG. 2), exposed to light, and then developed to be formed into a pattern covering the metal supporting layer 17 including the insulating base layer 5, the conductive layer 6, the insulating cover layer 7, the first stepped portions 8, and the second stepped portions 9.

The thickness of the first etching resist 14 is in a range of, e.g., 5 to 40 μm, or preferably 10 to 25 μm.

On the other hand, as shown in FIG. 6(f), a second etching resist 15 as the etching resist is formed on the lower surface of the metal supporting layer 17 such that first openings 16 and second openings 18 are formed therein.

In the second etching resist 15, the first openings 16 correspond to the first to-be-removed regions 21 and the second to-be-removed regions not shown, and are formed so as to expose the first to-be-removed regions 21 and the second to-be-removed regions not shown. Each of the first openings 16 is formed in a generally circular shape in bottom view concentric with the first stepped portion 8. Specifically, the first openings 16 are formed to have the same diameter as that of the first to-be-removed regions 21 and the second to-be-removed regions in the thickness direction of the second etching resist 15.

The inner diameter d4 of the first opening 16 is slightly smaller than the inner diameter d1 of the upper end portion of each of the first reference holes 12, and is in a range of, e.g., 170 to 1170 μm, or preferably 370 to 970 μm.

The distance L4 between the inner circumferential surface of the first opening 16 and the inner circumferential surface of the stepped base layer 31 is in a range of, e.g., 20 to 120 μm, or preferably 25 to 50 μm.

In the second etching resist 15, the second openings 18 correspond to the portions of the metal supporting layer 17 where the slits 39 and the gap grooves 19 (see FIG. 2) are to be formed, and are formed so as to individually expose the slits 39 and the gap grooves 19.

The second etching resist 15 is formed into a pattern in which the first openings 16 and the second openings 18 each described above are formed by, e.g., laminating a dry film resist on the entire lower surface of the metal supporting layer 17, exposing the dry film resist to light, and then developing the dry film resist.

The thickness of the second etching resist 15 is in a range of, e.g., 5 to 40 μm, or preferably 10 to 25 μm.

Next, as shown in FIG. 6(g), the portions of the metal supporting layer 17 exposed from the second openings 18 of the second etching resist 15 are removed by etching, while the first to-be-removed regions 21 and the second to-be-removed regions (not shown) which are exposed from the first openings 16 of the second etching resist 15 are simultaneously removed by etching.

In the etching of the metal supporting layer 17 (including the first to-be-removed regions 21 and the second to-be-removed regions) described above, a known etchant such as an acidic solution is used. Examples of the acidic solution include an aqueous ferric chloride solution, a hydrogen peroxide/sulfuric acid solution mixture, an aqueous ammonium persulfate solution, and an aqueous sodium persulfate solution. In a process using the etchant, a known method (wet etching method) such as a dipping method or a spraying method is used.

In this manner, the slits 39 (see FIG. 2) are formed to form a gimbal 22, and the gap grooves 19 are simultaneously formed to form, from the metal supporting layer 17, the suspension boards with circuit 2 each including the metal supporting board 4, the support frame 3 supporting the suspension boards with circuit 2 in an aligned state, and the joint portions 38 coupling the suspension boards with circuit 2 to the support frame 3. At the same time, the first reference holes 12 are formed in the metal supporting layer 17 in each of the suspension boards with circuit 2, while the second reference holes 13 are simultaneously formed in the support frame 3.

Thereafter, as shown in FIG. 6(h), the first etching resist 14 and the second etching resist 15 are removed. The first etching resist 14 and the second etching resist 15 are removed by, e.g., stripping, etching, or the like.

Then, in this method, the first stepped portions 8 and the second stepped portions 9 each described above are formed. Subsequently, in the reference hole forming step, the first etching resist 14 is formed on the metal supporting layer 17 so as to cover the first stepped portions 8 and the second stepped portions 9. This can ensure a larger contact area between the first etching resist 14 and each of the metal supporting layer 17, the first stepped portions 8, and the second stepped portions 9 around the first reference holes 12 and the second reference holes 13, and improve the adherence therebetween.

Further, with the first stepped part 10 and the second stepped part 11, it is possible to ensure hook-like engagement with the first etching resist 14, and therefore further improve the adherence between the first etching resist 14 and each of the first stepped part 10 and the second stepped part 11.

As a result, even when the second etching resist 15 is formed on the lower surface of the metal supporting board 4 formed from the metal supporting layer 17 so as to expose the first to-be-removed regions 21, and then the first to-be-removed regions 21 are removed by etching, it is possible to prevent the etchant from entering the interface between the first etching resist 14 and the metal supporting board 4 around the first to-be-removed regions 21, and prevent the first etching resist 14 from being delaminated from the metal supporting board 4 and the first stepped portions 8.

In addition, even when the second etching resist 15 is formed on the lower surface of the support frame 3 so as to expose the second to-be-removed regions, and then the second to-be-removed regions are removed by etching, it is possible to prevent the etchant from entering the interface between the first etching resist 14 and the support frame 3 around the second to-be-removed regions, and prevent the first etching resist 14 from being delaminated from the support frame 3 and the second stepped portions 9.

Therefore, it is possible to prevent an increase in the minimum diameter D of each of the first reference holes 12 and the second reference holes 13 resulting from the entrance of the etchant, and uniformly form the first reference holes 12 and the second reference holes 13 with excellent accuracy.

As a result, by improving the accuracy of positioning of the magnetic head and the accuracy of positioning of each of the suspension boards with circuit 2 with respect to the load beam, the reliability of connection with the suspension board with circuit 2 can be improved.

In the description given above, the first etching resist 14 and the second etching resist 15 are successively formed. However, it is also possible to, e.g., simultaneously form the first etching resist 14 and the second etching resist 15, though not shown.

Figure 11:
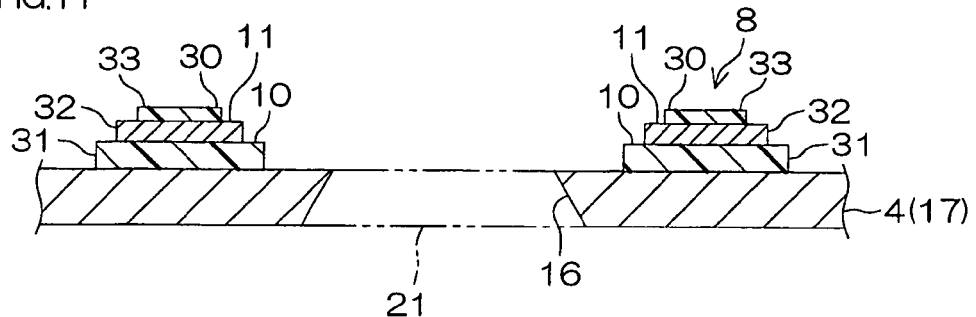
FIG. 11 is an enlarged cross-sectional view of a first reference hole and a first stepped portion (tri-level implementation formed of a stepped base layer, a stepped conductive layer, and a stepped cover layer) in a suspension board with circuit which is yet another embodiment of the wired circuit board of the present invention.
Figure 12:
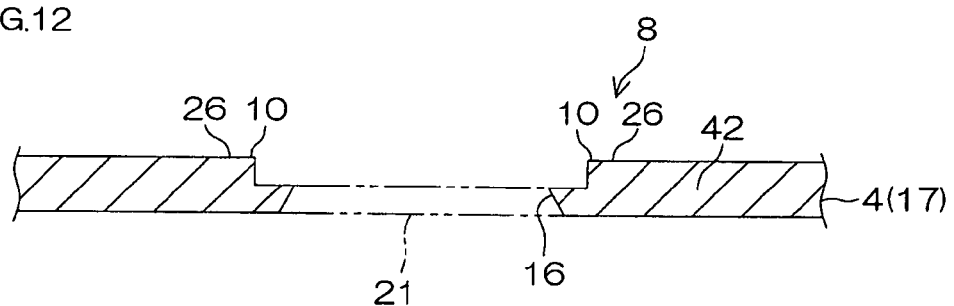
FIG. 12 is an enlarged cross-sectional view of a first reference hole and a first stepped portion (implementation formed of a stepped metal portion which rises in level from a radially inner lower position to a radially outer higher position) in a suspension board with circuit which is still another embodiment of the wired circuit board of the present invention.
Figure 13:
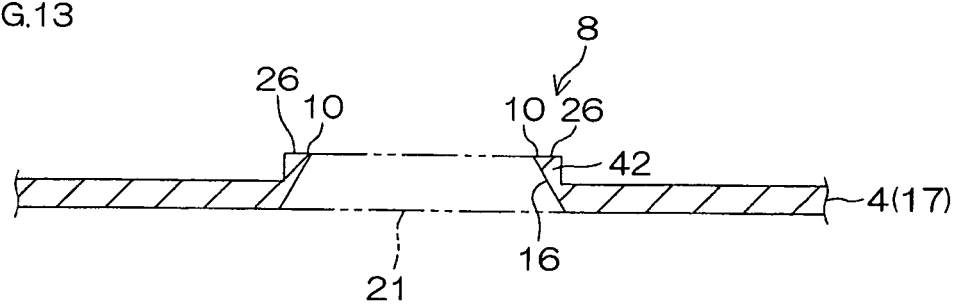
FIG. 13 is an enlarged cross-sectional view of a first reference hole and a first stepped portion (implementation formed of a stepped metal portion which drops in level from a radially inner higher position to a radially outer lower position) in a suspension board with circuit which is yet another embodiment of the wired circuit board of the present invention.

FIGS. 7 to 13 are enlarged cross-sectional views of first reference holes and first stepped portions in suspension boards with circuit which are other embodiments of the wired circuit of the present invention. FIG. 7 shows a bi-level implementation in which the first stepped portion is formed of a stepped based layer and a stepped conductive layer. FIG. 8 shows a bi-level implementation in which the first stepped portion is formed of a stepped base layer and a stepped cover layer in which a stepped conductive layer is not embedded. FIG. 9 shows a bi-level implementation in which the first stepped portion is formed of a stepped conductive layer and a stepped cover layer. FIG. 10 shows a mono-level implementation in which the first stepped portion is formed of a stepped base layer or a stepped cover layer. FIG. 11 shows a tri-level implementation in which the first stepped portion is formed of a stepped base layer, a stepped conductive layer, and a stepped cover layer. FIG. 12 shows an implementation in which the first stepped portion is formed of a stepped metal portion which rises in level from a radially inner lower position to a radially outer higher position. FIG. 13 shows an implementation in which the first stepped portion is formed of a stepped metal portion which drops in level from a radially inner higher position to a radially outer lower position.

Note that, in each of the drawings described hereinbelow, the members corresponding to the individual components described above are provided with the same reference numerals, and a detailed description thereof is omitted.

In the description of FIG. 3 given above, the first stepped part 10 of each of the first stepped portions 8 is formed from the stepped base layer 31, and the second stepped part 11 thereof is formed from the stepped cover layer 33. However, the first stepped part 10 and the second stepped part 11 are not limited to a combination of the individual layers shown above. For example, as shown in FIG. 7, the first stepped part 10 can be formed from the stepped base layer 31, and the second stepped part 11 can be formed from the stepped conductive layer 32. Alternatively, as shown in FIG. 8, the first stepped part 10 can be formed from the stepped base layer 31, and the second stepped part 11 can be formed from the stepped cover layer 33 in which the stepped conductive layer 32 is not embedded. Otherwise, as shown in FIG. 9, the first stepped part 10 can also be formed from the stepped conductive layer 32, and the second stepped part 11 can also be formed from the stepped cover layer 33.

In FIG. 7, the first stepped portion 8 does not include the stepped cover layer 33, but includes the stepped base layer 31 and the stepped conductive layer 32.

In the first stepped portion 8, the upper surface and inner circumferential surface of the inner end portion of the stepped base layer 31 protruding from the inner circumferential surface of the stepped conductive layer 32 in a radially inward direction form the first stepped part 10, and the upper surface and inner circumferential surface of the inner end portion of the stepped conductive layer 32 form the second stepped part 11.

In FIG. 8, the first stepped portion 8 does not include the stepped conductive layer 32, but includes the stepped base layer 31 and the stepped cover layer 33.

In the first stepped portion 8, the upper surface and inner circumferential surface of the inner end portion of the stepped base layer 31 protruding from the inner circumferential surface of the stepped cover layer 33 in a radially inward direction form the first stepped part 10, and the upper surface and inner circumferential surface of the inner end portion of the stepped cover layer 33 form the second stepped part 11.

In FIG. 9, the first stepped portion 8 does not include the stepped base layer 31, but includes the stepped conductive layer 32 and the stepped cover layer 33.

In the first stepped portion 8, the upper surface and inner circumferential surface of the inner end portion of the stepped conductive layer 32 protruding from the inner circumferential surface of the stepped cover layer 33 in a radially inward direction form the first stepped part 10, and the upper surface and inner circumferential surface of the inner end portion of the stepped conductive layer 32 form the second stepped part 11.

In the description given above, the number of levels in the first stepped portion 8 is set to 2 (levels). However, the number of levels is not limited thereto. For example, the number of levels can be set to 1 (level) as shown in FIG. 10, or set to 3 (levels) as shown in FIG. 11. It is also possible to provide a plurality of levels which are not less than four (levels), though not shown.

In FIG. 10, the first stepped portion 8 includes only the stepped base layer 31 or the stepped cover layer 33, and the upper surface and inner circumferential surface of the inner end portion of the stepped base layer 31 or the stepped cover layer 33 form the first stepped part 10.

However, it is also possible that the first stepped portion 8 is formed only from the stepped conductive layer 32, and the upper surface and inner circumferential surface of the inner end portion of the stepped conductive layer 32 form the first stepped part 10, though not shown.

In FIG. 11, in the first stepped portion 8, the inner end portion and outer end portion of the stepped base layer 31 are exposed from the stepped conductive layer 32, and the inner end portion and outer end portion of the stepped conductive layer 32 are exposed from the stepped cover layer 33.

In the first stepped portion 8, the upper surface and inner circumferential surface of the inner end portion of the stepped base layer 31 protruding from the inner circumferential surface of the stepped conductive layer 32 in a radially inward direction form the first stepped part 10, the upper surface and inner circumferential surface of the inner end portion of the stepped conductive layer 32 protruding from the inner circumferential surface of the stepped cover layer 33 in a radially inward direction form the second stepped part 11, and the upper surface and inner circumferential surface of the inner end portion of the stepped cover layer 33 form a third stepped part 30.

The first stepped portion 8 includes the first stepped part 10, the second stepped part 11, and the third stepped part 30, and is formed in a tri-level stepped shape in which each of the first stepped part 10, the second stepped part 11, and the third stepped part 30 stepwise rises in level from a radially inner lower position to a radially outer higher position.

Also in the description give above, the first stepped portion 8 is formed any of the stepped base layer 31, the stepped conductive layer 32, and the stepped cover layer 33. However, it is also possible to, e.g., form the first stepped portion 8 from a stepped metal portion 26 of the metal supporting layer 17 without forming the first stepped portion 8 from any of the layers shown above, as shown in FIGS. 12 and 13.

In FIG. 12, the stepped metal portion 26 is formed as a remaining portion 42 of the metal supporting layer 17 remaining in the region other than the first to-be-removed region 21 and the periphery thereof after the first to-be-removed region 21 of the metal supporting layer 17 prior to the reference hole forming step and the upper portion of the periphery thereof are removed.

The upper surface and inner circumferential surface of the inner end portion of the stepped metal portion 26 form the first stepped part 10. That is, the first stepped portion 8 includes the first stepped part 10, and is formed in a mono-level stepped shape which stepwise rises in level from a radially inner lower position to a radially outer higher position.

In FIG. 13, the stepped metal portion 26 is formed as the remaining portion 42 of the metal supporting layer 17 remaining in the vicinity of the first to-be-removed region 21 after the upper portion of the metal supporting layer 17 prior to the reference hole forming step is uniformly removed except in the first to-be-removed region 21 and the periphery thereof.

The upper surface and outer circumferential surface of the outer end portion of the stepped metal portion 26 form the first stepped part 10. That is, the first stepped portion 8 includes the first stepped part 10, and is formed in a mono-level stepped shape which stepwise drops in level from a radially inner higher position to a radially outer lower position.

In the description given above, the magnetic head is positioned or each of the suspension boards 2 with circuit is positioned with respect to the load beam using the two different kinds of reference holes, i.e., the first reference holes 12 and the second reference holes 13. However, it is also possible to perform positioning using, e.g., either the first reference holes 12 or the second reference holes 13.

In the description given above, the first stepped portions 8 (and the second stepped portions 9) are formed over the metal supporting layer 17 (and the metal supporting board 4). However, it is also possible to, e.g., form the first stepped portions 8 (and the second stepped portions 9) under the metal supporting layer 17 (and the metal supporting board 4), though not shown. In that case, the first etching resist 14 and the second etching resist 15 are formed in vertically inverted relation, and the first openings 16 are formed in the upper portion of the metal supporting layer 17.

Preferably, the first stepped portions 8 (and the second stepped portions 9) are formed on the metal supporting layer 17 (and the metal supporting board 4). This allows the stepped base layer 31, the stepped conductive layer 32, and the stepped cover layer 33 to be formed on the same side of the metal supporting layer 17 as the insulating base layer 5, the conductive layer 6, and the insulating cover layer 7, i.e., on the upper side. In addition, the stepped base layer 31, the stepped conductive layer 32, and the stepped cover layer 33 can be formed as the same layers as the insulating base layer 5, the conductive layer 6, and the insulating cover layer 7. As a result, the production process can be simplified, and the first stepped portions 8 and the second stepped portions 9 can be formed with more excellent accuracy to allow the first reference holes 12 and the second reference holes 13 to be formed more uniformly with more excellent accuracy.

In the description given above, the first stepped portions 8 and the second stepped portions 9 are each formed in a generally annular plan view shape, but the plan view shape thereof is not particularly limited. For example, the first stepped portions 8 and the second stepped portions 9 can be each formed into an appropriate shape such as, e.g., a generally triangular frame-like shape or a generally rectangular frame-like shape.

In the description given above, the suspension-board-with-circuit assembly sheet 1 including the suspension boards with circuit 2 is shown as an example of the wired circuit board of the present invention. However, the wired circuit board of the present invention can also be used as, e.g., a flexible-wired-circuit-board assembly sheet including flexible wired circuit boards each including the metal supporting layer 17 as a reinforcement layer.

EXAMPLES

Hereinbelow, the present invention is described more specifically by showing the example and comparative example thereof. However, the present invention is by no means limited thereto.

Example 1

First, a metal supporting layer made of stainless steel in a rectangular flat-plate shape in plan view was prepared (see FIG. 5(a)). The thickness of the metal supporting layer was 20 µm.

Then, a varnish of a photosensitive polyamic acid resin was coated on the entire upper surface of the metal supporting board, heated, dried, exposed to light via a photomask, and then developed with an alkaline developer. Thereafter, the coating was cured by heating to form an insulating base layer and a stepped base layer each made of polyimide in the foregoing pattern (see FIG. 5(b)).

The thickness of each of the insulating base layer and the stepped base layer was 10 µm. The width of the stepped base layer was 300 µm, and the inner diameter (d3) thereof was 840 µm.

Then, over the metal supporting board, the insulating base layer, and the stepped base layer, a chromium thin film and a copper thin film were successively formed by a sputtering method to form a metal thin film. Thereafter, on the surface of the metal thin film, a plating resist was formed from a dry film resist into a pattern reverse to that of a conductive layer and a stepped conductive layer. Then, the conductive layer and the stepped conductive layer were simultaneously formed by electrolytic copper plating. Thereafter, the plating resist was stripped, and the metal thin film exposed from a conductive pattern and the stepped conductive layer was removed by etching (see FIG. 5(c)).

The thickness of each of the conductive layer and the stepped conductive layer was 12 µm. The width of the stepped conductive layer was 215 µm. The distance (L2) between the inner circumferential surface of the stepped conductive layer and the inner circumferential surface of the stepped base layer was 30 µm.

Then, a varnish of a photosensitive polyamic acid resin was coated on the entire upper surface of the metal supporting layer including the insulating base layer, the stepped base layer, the conductive layer, and the stepped conductive layer, heated, dried, exposed to light via a photomask, and then developed with an alkaline developer. Thereafter, the coating was cured by heating to form an insulating cover layer and a stepped cover layer each made of polyimide in the foregoing pattern (see FIG. 5(d)).

The thickness of each of the insulating cover layer and the stepped cover layer was 5 µm. The width of the stepped cover layer was 290 µm. The distance (L3) between the inner circumferential surface of the stepped cover layer and the inner circumferential surface of the stepped base layer was 5 µm.

In this manner, first stepped portions and second stepped portions each including the stepped base layer, the stepped conductive layer, and the stepped cover layer and having a thickness of 27 µm were simultaneously formed. Note that each of the first stepped portions and the second stepped portions had a bi-level stepped shape, and was formed to have the same size.

Then, slits and gap grooves were formed by etching, while first reference holes and second reference holes were simultaneously formed by etching (see FIGS. 6(e) to 6(h)).

That is, a dry film resist was laminated first on the entire upper surface of the metal supporting layer including the insulating base layer, the conductive layer, the insulating cover layer, the first stepped portions, and the second stepped portions. Then, the dry film resist was exposed to light, and developed to form a first etching resist in a pattern covering the metal supporting layer including the insulating base layer, the conductive layer, the insulating cover layer, the first stepped portions, and the second stepped portions (see FIG. 6(e)). Note that the thickness of the first etching resist was 40 µm.

Then, the dry film resist was laminated on the entire lower surface of the metal supporting layer, exposed to light via a photomask, and developed to form a second etching resist in the foregoing pattern formed with first openings and second openings (see FIG. 6(f)).

The inner diameter (d4) of each of the first openings was 770 µm, and the distance (L4) between the inner circumferential surface of the first opening and the inner circumferential surface of the stepped base layer was 20 µm. The thickness of the second etching resist was 25 µm.

Thereafter, the portions of the metal supporting layer exposed from the second openings of the second etching resist were removed by etching, while first to-be-removed regions and second to-be-removed regions which were exposed from the first openings of the second etching resist were simultaneously removed by etching (see FIG. 6(g)).

In the etching, a dipping method using an aqueous ferric chloride solution as an etchant was implemented.

In this manner, the slits were formed to form a gimbal, and the gap grooves were simultaneously formed, whereby the suspension boards with circuit each including the metal supporting board, a support frame, and joint portions were formed from the metal supporting layer. At the same time, the first reference holes were formed in the metal supporting layer in the suspension boards with circuit, while the second reference holes were simultaneously formed in the support frame.

The first reference holes and the second reference holes were each formed in a trapezoidal cross-sectional shape which gradually upwardly tapered in width in inclined relation, and the minimum diameter (D), i.e., the inner diameter (d1) of the upper end portion thereof was about 800 µm. Note that the inner diameter (d2) of the lower end portion of each of the first reference holes and the second reference holes was 820 µm.

The distance (L1) between the inner circumferential surface of the stepped base layer and the inner circumferential surface (upper end edge) of the first reference hole was 50 µm.

Thereafter, the first etching resist and the second etching resist were removed by stripping (see FIG. 6(h)).

In this manner, a suspension-board-with-circuit assembly sheet was obtained (see FIGS. 1 and 2).

Comparative Example 1

A suspension-board-with-circuit assembly sheet was obtained in the same manner as in EXAMPLE 1 except that the first stepped portions and the second stepped portions (the stepped base layer, the stepped conductive layer, and the stepped cover layer) were not provided in COMPARATIVE EXAMPLE 1.

(Evaluation)

Figure 14:
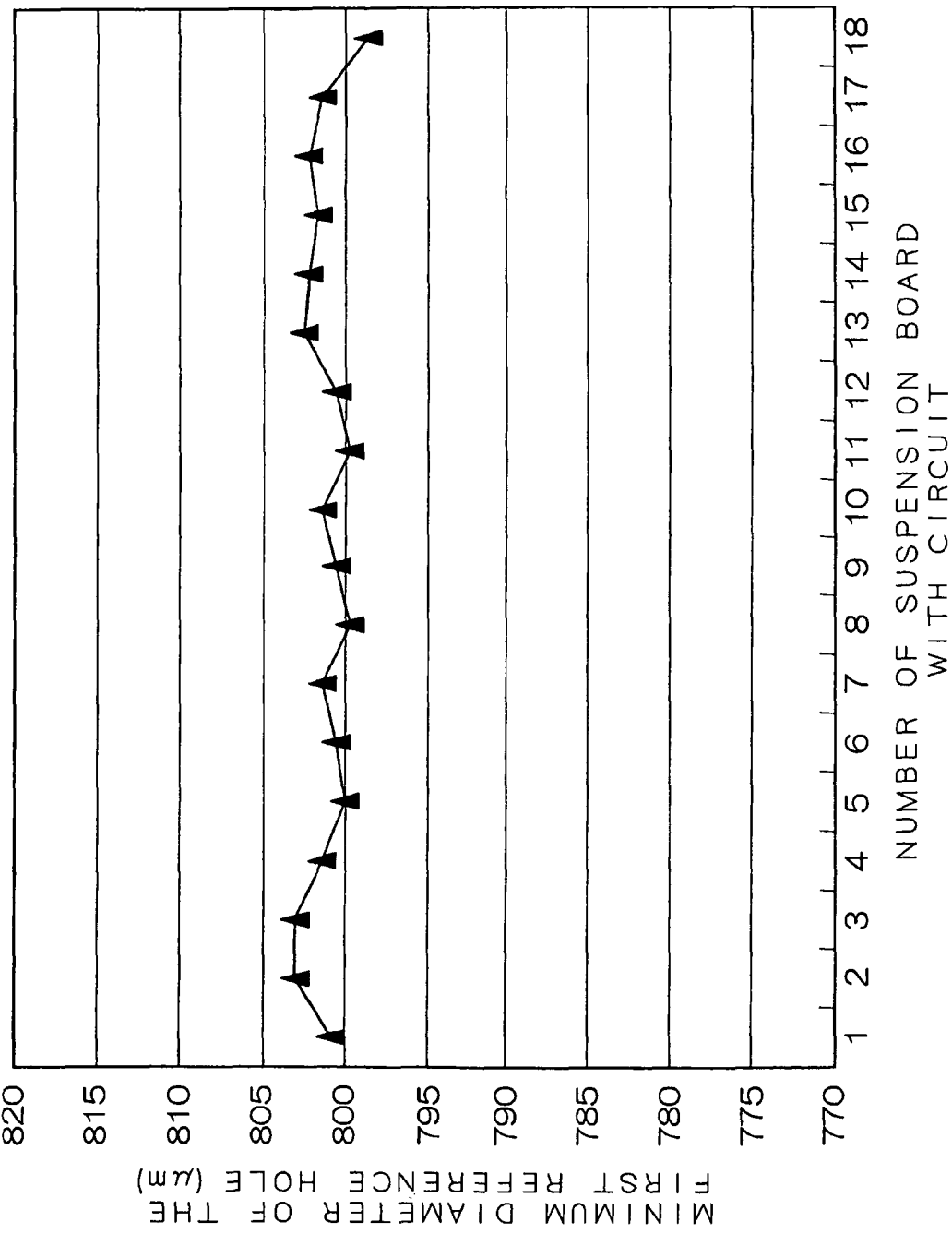
FIG. 14 is a graph showing a measurement value of the minimum diameter of the first reference hole of EXAMPLE 1.

The minimum diameter (D) of the plurality of first reference holes of the suspension-board-with-circuit assembly sheet of EXAMPLE 1 was measured using a measuring device. The result of the measurement is shown in FIG. 14. The standard deviation (a) of the measurement values of the minimum diameter (D) of EXAMPLE 1 was 0.0012.

Figure 15:
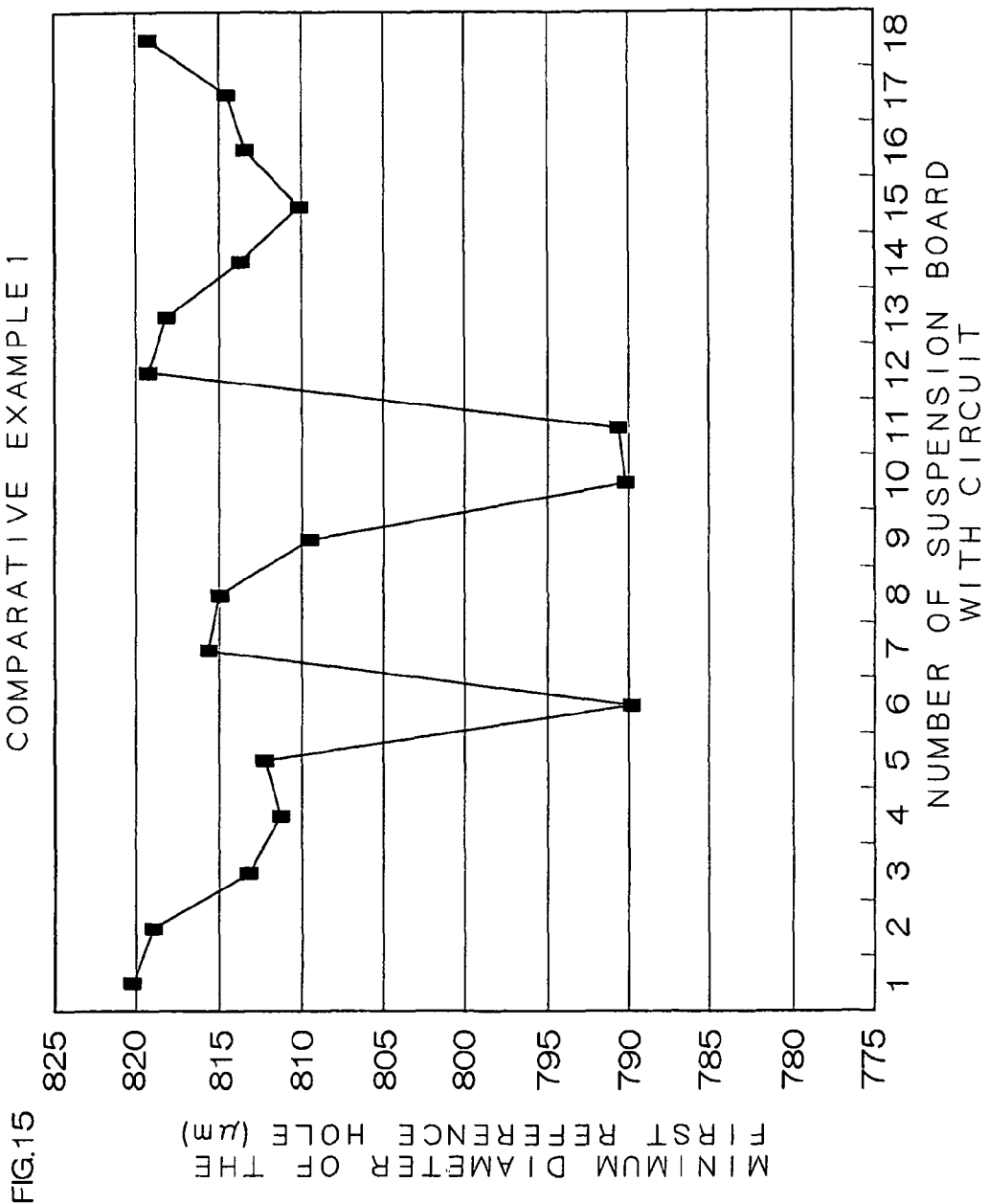
FIG. 15 is a graph showing a measurement value of the minimum diameter of the first reference hole of COMPARATIVE EXAMPLE 1.

Additionally, in the same manner as described above, the minimum diameter (D) of the first reference holes of the suspension-board-with-circuit assembly sheet of COMPARATIVE EXAMPLE 1 was also measured. The result of the measurement is shown in FIG. 15. The standard deviation (a) of the measurement values of the minimum diameter (D) of COMPARATIVE EXAMPLE 1 was 0.0049.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A wired circuit board, comprising:
a metal supporting layer;
an insulating layer formed on the metal supporting layer; and
a conductive layer formed on the insulating layer,
wherein a reference hole for positioning is formed in the metal supporting layer, and a stepped portion is formed so as to surround on all sides the reference hole; and
wherein the stepped portion is formed in at least one of: a) the same layer as the insulating layer, b) the same layer as the conductive layer, or c) directly in the metal supporting layer.

2. The wired circuit board according to claim 1, wherein a distance between the stepped portion and the reference hole is not more than 100 μm.

3. The wired circuit board according to claim 1, wherein the stepped portion has a thickness of not less than 5 μm.

4. The wired circuit board according to claim 1, wherein the insulating layer is formed of polyimide.

5. The wired circuit board according to claim 1, wherein the conductive layer is formed of copper.

6. The wired circuit board according to claim 1, which is used as a suspension board with circuit.

7. A producing method of a wired circuit board, comprising:
the step of forming a metal supporting layer, forming an insulating layer on the metal supporting layer, and forming a conductive layer on the insulating layer;
the step of forming a stepped portion, which is formed in at least one of: a) the same layer as the insulating layer, b) the same layer as the conductive layer, or c) directly in the metal supporting layer, such that a to-be-removed region for boring a reference hole used for positioning is surrounded on all sides by the stepped portion; and
a reference hole forming step of etching the to-be-removed region of the metal supporting layer to form the reference hole, wherein
the reference hole forming step includes the steps of:
forming an etching resist so as to cover the stepped portion therewith on one side of the metal supporting layer in a thickness direction and expose the to-be-removed region on the other side of the metal supporting layer in the thickness direction;
removing the to-be-removed region exposed from the etching resist by etching; and
removing the etching resist.

8. The producing method of a wired circuit board according to claim 7, wherein the reference hole for positioning is circular, and
wherein the stepped portion is circular and is formed so as to concentrically surround the circular reference hole.

9. The producing method of a wired circuit board according to claim 8, wherein the circular stepped portion comprises a first stepped portion having a generally annular shape in plan view concentrically surrounding the circular reference hole.

10. The wired circuit board according to claim 1, wherein the reference hole for positioning is circular, and
wherein the stepped portion is circular and is formed so as to concentrically surround the circular reference hole.

11. The wired circuit board according to claim 10, wherein the circular stepped portion comprises a first stepped portion having a generally annular shape in plan view concentrically surrounding the circular reference hole.

12. A wired circuit board, comprising:
a metal supporting layer;
an insulating layer formed on the metal supporting layer; and
a conductive layer formed on the insulating layer,
wherein a reference hole for positioning is formed in the metal supporting layer, and a stepped portion is formed so as to surround on all sides the reference hole; and
wherein the stepped portion is formed in the same layer as the insulating layer and/or the conductive layer.

* * * * *